(12) United States Patent
Richter

(10) Patent No.: US 9,136,319 B2
(45) Date of Patent: Sep. 15, 2015

(54) METHOD OF MAKING CAPACITOR WITH A SEALING LINER AND SEMICONDUCTOR DEVICE COMPRISING SAME

(75) Inventor: Ralf Richter, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 507 days.

(21) Appl. No.: 13/332,619

(22) Filed: Dec. 21, 2011

(65) Prior Publication Data
US 2013/0164901 A1    Jun. 27, 2013

(51) Int. Cl.
*H01L 21/20* (2006.01)
*H01L 49/02* (2006.01)
*H01L 21/768* (2006.01)

(52) U.S. Cl.
CPC ........... *H01L 28/90* (2013.01); *H01L 21/76831* (2013.01)

(58) Field of Classification Search
USPC .......... 438/381–386, 532, 627, 643; 257/408, 257/532, 751, 774, E21.008, E21.575, 257/E21.584, E23.011, E23.155
See application file for complete search history.

(56) References Cited

U.S. PATENT DOCUMENTS

| | | | |
|---|---|---|---|
| 2009/0267186 A1* | 10/2009 | Cheng et al. | 257/533 |
| 2009/0273085 A1* | 11/2009 | Jourdan et al. | 257/751 |
| 2012/0061798 A1* | 3/2012 | Wong et al. | 257/532 |
| 2012/0199980 A1* | 8/2012 | Pfuetzner et al. | 257/774 |

* cited by examiner

*Primary Examiner* — Charles Garber
*Assistant Examiner* — Abdulfattah Mustapha
(74) *Attorney, Agent, or Firm* — Amerson Law Firm, PLLC

(57) ABSTRACT

Generally, the subject matter disclosed herein relates to various methods of making a capacitor with a sealing liner and a semiconductor device including such a capacitor. In one example, the method includes forming a layer of insulating material, forming a capacitor opening in the layer of insulating material, forming a sealing liner on the sidewalls of the capacitor opening and forming a first metal layer in the capacitor opening and on the sealing liner by performing a process using a precursor having a minimum particle size, wherein the sealing liner is made of a material having an opening size that is less than the minimum particle size of the precursor.

12 Claims, 3 Drawing Sheets

METHOD OF MAKING CAPACITOR WITH A SEALING LINER AND SEMICONDUCTOR DEVICE COMPRISING SAME

BACKGROUND

1. Field of the Disclosure

Generally, the present disclosure relates to sophisticated integrated circuits, and, more particularly, to various methods of making a capacitor with a sealing liner and a semiconductor device including such a capacitor.

2. Description of the Related Art

In modern ultra-high density integrated circuits, device features have been steadily decreasing in size to enhance the performance of the semiconductor device and the overall functionality of the circuit. However, commensurate with the on-going shrinkage of feature sizes, certain size-related problems arise that may at least partially offset the advantages that may be obtained by simple size reduction alone. Generally speaking, decreasing the size of, for instance, circuit elements such as MOS transistors and the like, may lead to superior performance characteristics due to a decreased channel length of the transistor element, thereby resulting in higher drive current capabilities and enhanced switching speeds. Upon decreasing channel length, however, the pitch between adjacent transistors likewise decreases, thereby limiting the size of the conductive contact elements—e.g., those elements that provide electrical connection to the transistor, such as contact vias and the like—that may fit within the available real estate. Accordingly, the electrical resistance of conductive contact elements becomes a significant issue in the overall transistor design, since the cross-sectional area of these elements is similarly decreased. Moreover, the cross-sectional area of the contact vias, together with the characteristics of the materials they comprise, may have a significant influence on the effective electrical resistance and overall performance of these circuit elements.

Thus, improving the functionality and performance capability of various metallization systems has become important in designing modern semiconductor devices. One example of such improvements is the enhanced use of copper metallization systems in integrated circuit devices and the use of so-called "ultra-low-k" dielectric materials ("ULK" materials having a dielectric constant less than 2.8 in such devices. Copper metallization systems exhibit improved electrical conductivity as compared to, for example, prior art metallization systems using tungsten for the conductive lines and vias. The use of ULK dielectric materials also tends to improve the signal-to-noise ratio (S/N ratio) by reducing crosstalk as compared to other dielectric materials with higher dielectric constants.

However, the use of such ULK materials is not without drawbacks. For example, such ULK materials tend to be more porous than dielectric materials having a higher k value.

While the increased porosity of the ULK materials, and thus the very low k value of such materials, is beneficial to many aspects of an integrated circuit device, e.g., reduced cross-talk, increased operating speed, such porosity can create problems when it comes to manufacturing certain types of devices. As one example, an illustrative eDRAM (embedded dynamic random access memory) array includes, among other things, a plurality of capacitors 110 (e.g., either single-sided or double-sided capacitors) that are electrically coupled to a plate contact. The capacitors are formed in a layer ULK dielectric material such as, for example, porous SiCOH (k32 2.4), that is formed above the surface of a semiconducting substrate. The capacitor typically has a metal-insulator-metal (MIM) configuration that includes a bottom electrode, a top electrode and a layer of insulating material positioned between the bottom electrode and the top electrode. Such a capacitor is typically formed by defining an opening in a layer of ULK material, conformably depositing a first metal layer (the bottom electrode), e.g., titanium nitride, in the opening, forming a layer of insulating material (e.g., a high-k material having a dielectric constant greater than 10) on the first metal layer and thereafter, filling the remaining portions of the opening in the ULK material with another metal, such as titanium.

In some cases, the ULK material may have openings that are approximately 2 nm in size. The first metal layer is typically formed by performing a chemical based process, such as an atomic layer deposition (ALD) process that involves the use of certain precursors. In the case where the first metal layer is titanium nitride, the deposition process involves the use of an organic metal nitride precursor that has a particle size of about 0.7 nm. During this formation of the first metal layer, some of the precursor material may infiltrate the ULK material at least to some degree. In turn, such infiltrating precursor material can lead several problems, such as the creation of undesirable regions of higher conductivity in the ULK material, the creation of conductive paths that may lead to short circuits, the undesirable increase (at least locally) in the k value of the ULK materials, etc. Such problems can lead to reduced device performance and, in some cases, to complete device failure.

The present disclosure relates to methods and devices for avoiding or at least reducing the effects of one or more of the problems identified above.

SUMMARY OF THE DISCLOSURE

The following presents a simplified summary of the present disclosure in order to provide a basic understanding of some aspects disclosed herein. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the subject matter disclosed herein relates to various methods of making a capacitor with a sealing liner and a semiconductor device including such a capacitor. In one example, the method includes forming a layer of insulating material, forming a capacitor opening in the layer of insulating material, forming a sealing liner on the sidewalls of the capacitor opening and forming a first metal layer in the capacitor opening and on the sealing liner by performing a process using a precursor having a minimum particle size, wherein the sealing liner is made of a material having an opening size that is less than the minimum particle size of the precursor.

Another illustrative method disclosed herein includes forming a layer of ULK material, performing at least one etching process to form a capacitor opening in the layer of ULK material and depositing a layer of sealing material above the layer of ULK material and in the capacitor opening. In this example, the method also includes the steps of performing an anisotropic etching process on the layer of sealing material to thereby form a sealing liner on the sidewalls of the capacitor opening and forming a first metal layer in the capacitor opening and on the sealing liner by performing a process using a precursor having a minimum particle size, wherein the sealing liner is made of a material having an opening size that is less than the minimum particle size of the precursor.

BRIEF DESCRIPTION OF THE DRAWINGS

The disclosure may be understood by reference to the following description taken in conjunction with the accompanying drawings, in which like reference numerals identify like elements, and in which.

Figure 1A:
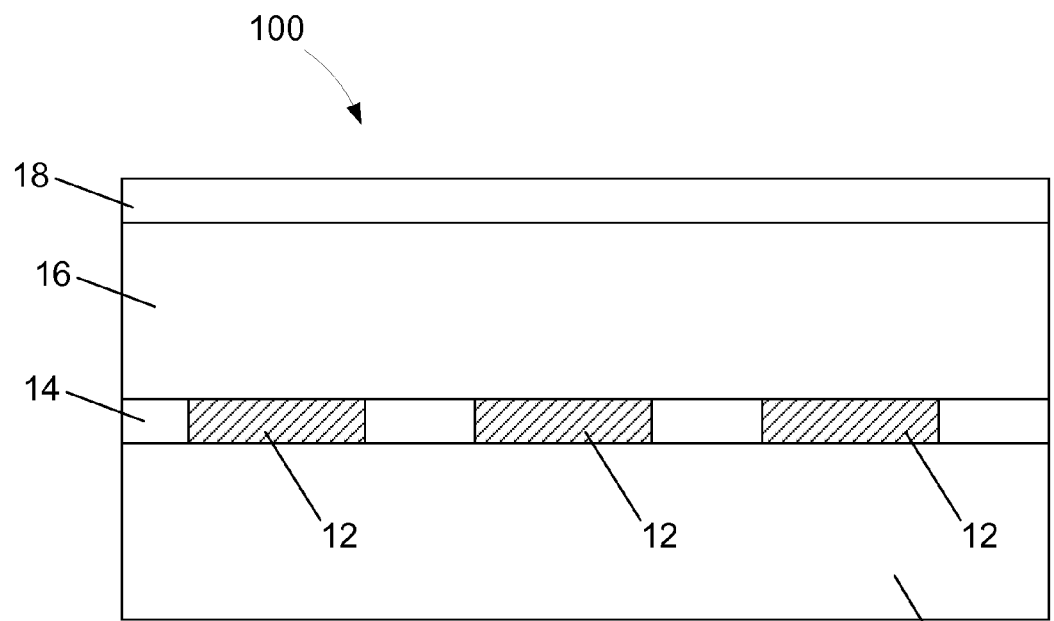
FIGS. 1A-1F depict various methods of making a capacitor for a memory device with a sealing liner and a memory device including such a capacitor.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of making a capacitor with a sealing liner and a semiconductor device including such a capacitor. As will be readily apparent to those skilled in the art upon a complete reading of the present application, the subject matter disclosed herein may be incorporated in a variety of devices, including, but not limited to, embedded memory devices, stand-alone memory devices, embedded DRAM memory devices, etc. With reference to FIGS. 1A-1F various illustrative embodiments of the methods and devices disclosed herein will now be described in more detail.

FIG. 1A depicts one illustrative embodiment the novel semiconductor device 100 disclosed herein. In the depicted embodiment, the illustrative device 100 may be part of an eDRAM (embedded dynamic random access memory) with a plurality of illustrative single sided capacitors formed in a memory array on the device 100. Of course, after a complete reading of the present application, those skilled in the art will readily appreciate that the inventions disclosed herein are not limited in application to semiconductor devices employing eDRAM memory devices or to single-sided capacitors.

FIG. 1A depicts the device 100 at an early stage of manufacturing. The device 100 is formed above a semiconducting substrate 10, such as bulk silicon substrate (depicted) or a silicon-on-insulator (SOI) substrate. A plurality of devices, e.g., transistors (not shown) is formed in and above the substrate 10. A layer of insulating material 14 is formed above the substrate 10. In the example depicted herein, a plurality of conductive structures 12 are formed in the layer of insulating material 14. The conductive structures 12 are intended to be representative in nature as they may represent any conductive structure that will ultimately be conductively coupled to a capacitor (not shown) to be formed there above. In one illustrative example, the conductive structures 12 are conductive contacts comprised of tungsten or aluminum that contact devices, e.g., the drain region of a transistor (not shown), formed in and above the substrate 10.

Also depicted in FIG. 1A are an insulating material layer 16 and a dielectric cap layer 18. In one illustrative example, the insulating material layer 16 may be made of a low-k material (k value less than 3) or a ULK material that has a k-value less than 2.8 The layers 16 and 18 may be formed from a variety of materials and they may be formed using traditional manufacturing processes, e.g., a chemical vapor deposition (CVD) process, or a plasma-enhanced version of such a process. In one illustrative example, the insulating material layer 16 may be a layer of porous SiCOH (k=2.4) (a ULK material) that is formed by a PECVD process, and the dielectric cap layer 18 may be a layer of TEOS based silicon dioxide. The size and scale of the various structures and layers depicted in the drawings are not to scale and certain features may be exaggerated to facilitate explanation of the inventions disclosed herein.

Figure 1B:
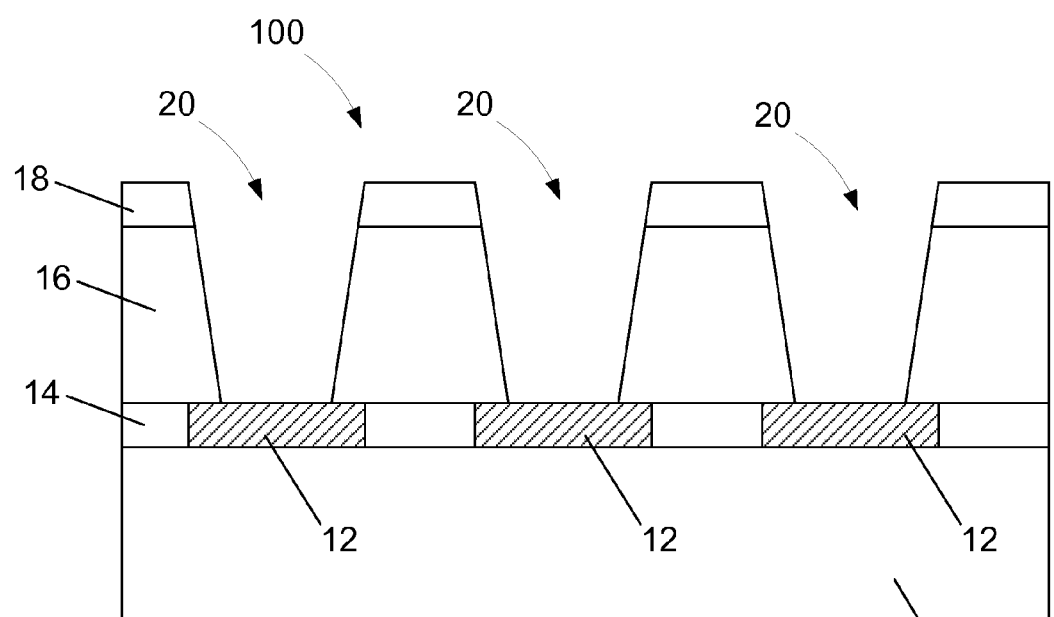

As shown in FIG. 1B, one or more etching processes are performed on the device 100 through a patterned mask layer (not shown), e.g., a patterned photoresist mask, to define a plurality of capacitor openings 20. In this illustrative embodiment, the capacitor openings 20 expose a portion of the conductive structures 12.

Figure 1C:
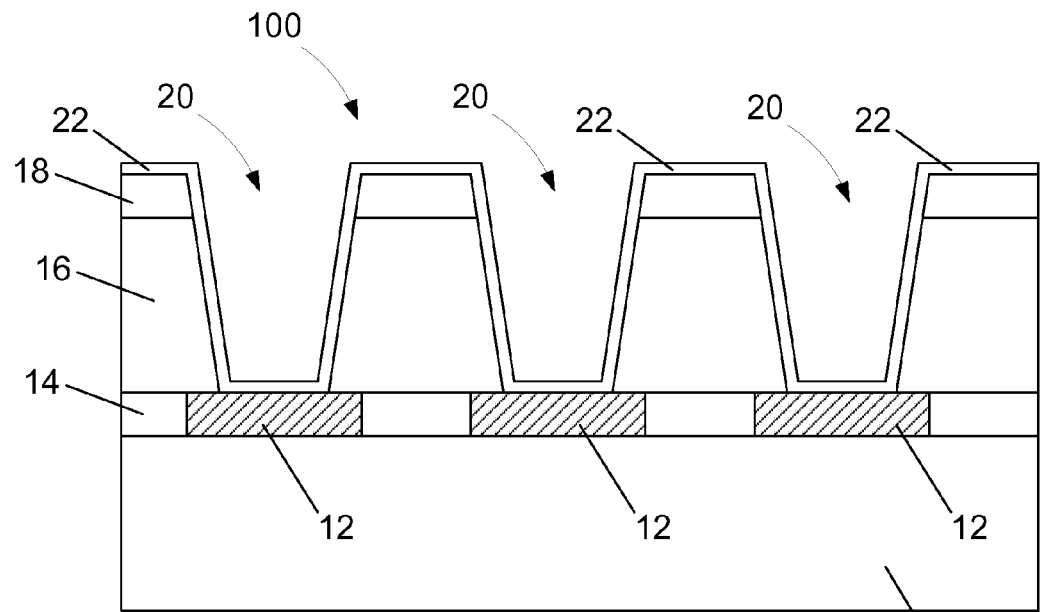

Next, as shown in FIG. 1C, a sealing material layer 22 is conformably deposited on the device 100 and in the capacitor openings 20. In one illustrative example, the sealing material layer 22 is layer of TEOS-based silicon dioxide that has a thickness of about 10 nm.

The sealing layer 22 should be made from a material that a minimum size opening that is less than the minimum particle size of any precursor that will be used in forming the bottom electrode for the capacitor that will be formed in the capacitor opening 20, as described more fully below. In the illustrative case where the sealing material layer 22 is comprised of TEOS-based silicon dioxide, the sealing material layer 22 has a maximum size opening that is smaller than the CVD-precursor material (typical value of about 1 nm down to about 0.5 nm or so for at least some CVD precursors) In general, in many applications the sealing material layer 22 may be made of a material having openings that are not greater than 0.4. The sealing material layer 22 may be formed by performing plasma-enhanced CVD process or an atomic layer deposition (ALD) process.

Figure 1D:
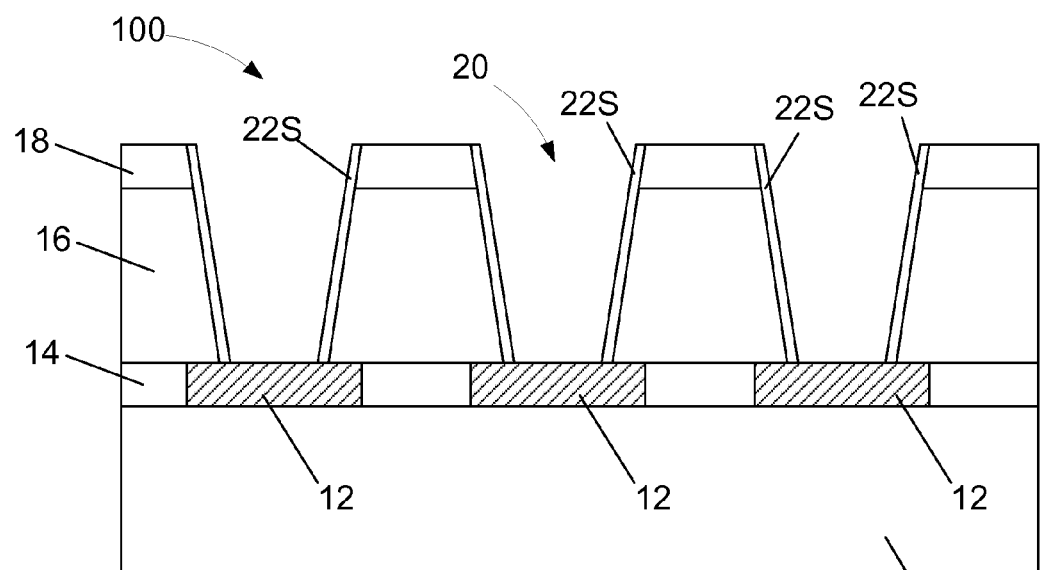

Next, as shown in FIG. 1D, an anisotropic etching process is performed to remove horizontally positioned portions of the sealing material layer 22 and thereby define sealing liners 22S on the walls of the capacitor openings 22.

The next process operation generally involves formation of the basic structures of the metal-insulator-metal capacitor that will be formed in the capacitor opening. Some aspects of one illustrative technique for forming such a capacitor will be described with reference to FIGS. 1E-1F. However, after a complete reading of the present application, those skilled in the art will understand that the present inventions are not limited to any particular technique employed in forming any particular type of capacitor.

Figure 1E:
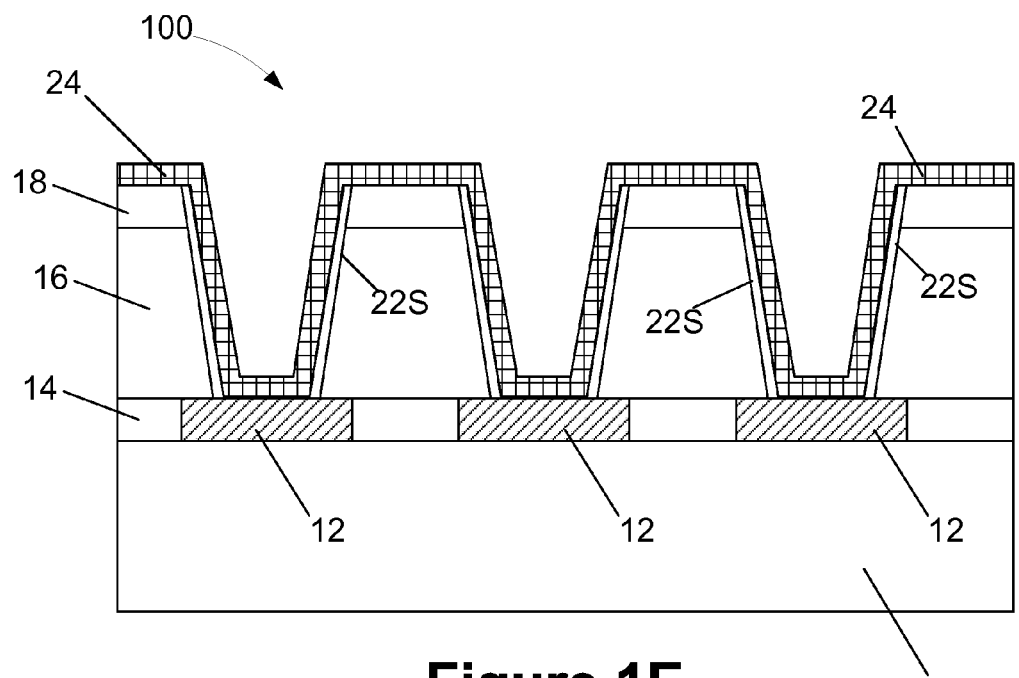

As shown in FIG. 1E, a first metal layer 24 is deposited above the device 100. Portions of the first metal layer 24 will ultimately become the bottom electrode of the capacitor. The first metal layer 24 may be comprised of a variety of different metals, and it may be formed using a variety of techniques. In one illustrative example, the first metal layer 24 is a layer of titanium nitride having a thickness of about 6-8 nm, that is formed by performing an ALD process. The first metal layer 24 is typically formed by performing a chemical based process, such as an atomic layer deposition (ALD) process that involves the use of certain precursors. In the case where the first metal layer 24 is titanium nitride, the deposition process involves the use of an organic metal nitride precursor that has a particle size of about 0.7 nm. However, depending upon the material selected for the first metal layer 24, and the precursor materials used in forming the layer, the precursor particle size may be as small as 0.5 nm. As noted above, sealing material layer 22, and thus the sealing liners 22S, should be made of a material that has openings no greater than the expected minimum precursor particle size used in forming the first metal layer 24. In one example, the sealing liners 22S should be made from a material having a maximum opening size of less than 0.4 nm. That is, in one example, the first step involves identifying a minimum precursor particle size to be used in the deposition process that will be performed to form the first metal layer 24, and thereafter, making the sealing liner 22S from a material that has a minimum opening size that is less than the minimum precursor particle size.

Figure 1F:
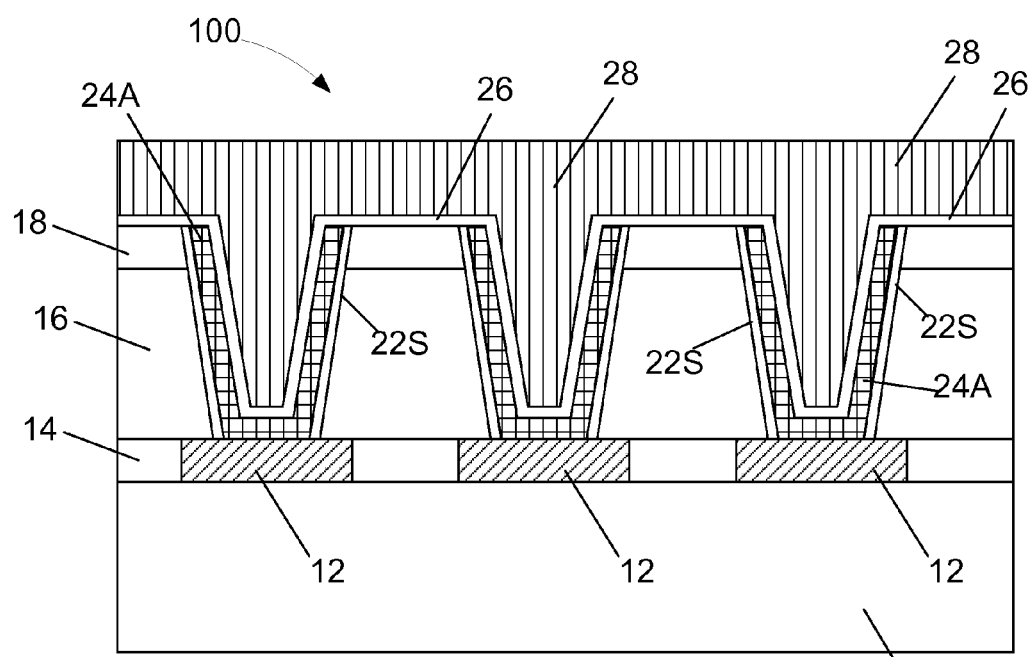

FIG. 1F depicts the device 100 after several process operations have been performed. More specifically, a chemical mechanical polishing (CMP) process was performed to remove excess portions of the first metal layer 24 positioned outside of the openings 20 to thereby define the bottom electrode 24A for each of the capacitors. Thereafter, a layer of insulating material 26 was conformably deposited across the device 100. The layer of insulating material 26 may be made from a variety of materials and it may be formed using a variety of techniques. In one illustrative example, the layer of insulating material 26 may be a high-k material (k value greater than 10), e.g., zirconium oxide, having a thickness of about 7-8 nm that is formed by a PECVD process. Next, a second metal layer 28 is blanket-deposited above the device 100 and in the remaining unfilled portions of the capacitor openings 20. Portions of the second metal layer 28 will become the top electrode for the illustrative capacitor depicted herein. The second metal layer 28 may be made from a variety of materials, e.g., titanium, titanium nitride, etc. and it may be formed using a variety of techniques. In one illustrative example, the second metal layer 28 is a layer of titanium that is formed by a PECVD process. Of course, additional process operations that are well known to those skilled in the art will be performed to complete the device 100.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a capacitor, comprising:
   forming a layer of insulating material;
   forming a capacitor opening in said layer of insulating material, said capacitor opening having sidewalls;
   forming a sealing liner that is positioned only on said sidewalls of said capacitor opening by depositing a layer of sealing material above said layer of insulating material and in said capacitor opening and performing an anisotropic etching process on said layer of sealing material that removes horizontally positioned portions of the layer of sealing material;
   forming a first metal layer in said capacitor opening and on said sealing liner by performing a process using a precursor having a minimum particle size, wherein said sealing liner is made of a material having an opening size that is less than said minimum particle size of said precursor;
   forming an insulating material layer on said first metal layer; and
   forming a second metal layer on said insulating material layer.

2. The method of claim 1, wherein said layer of insulating material is a low-k material or a ULK material.

3. The method of claim 1, where said sealing liner is comprised of silicon dioxide.

4. The method of claim 3, wherein forming said first metal layer comprises forming a layer of titanium nitride.

5. The method of claim 1, wherein said opening size of said sealing liner is 0.4 nm or less.

6. A method of forming a capacitor, comprising:
   forming a layer of ULK material;
   performing at least one etching process to form a capacitor opening in said layer of ULK material, said capacitor opening having sidewalls;
   depositing a layer of sealing material above said layer of ULK material and in said capacitor opening;
   performing an anisotropic etching process on said layer of sealing material that removes horizontally positioned portions of the layer of sealing material and thereby form a sealing liner that is positioned only on said sidewalls of said capacitor opening;
   forming a first metal layer in said capacitor opening and on said sealing liner by performing a process using a precursor having a minimum particle size, wherein said sealing liner is made of a material having an opening size that is less than said minimum particle size of said precursor;
   forming an insulating material layer on said first metal layer; and
   forming a second metal layer on said insulating material layer.

7. The method of claim 6, where said sealing liner is comprised of silicon dioxide.

8. The method of claim 7, wherein forming said first metal layer comprises forming a layer of titanium nitride.

9. The method of claim 6, wherein said insulating material layer is a layer of high-k material and wherein said second metal layer is comprised of titanium.

10. The method of claim 6, wherein said opening size of said sealing liner is 0.4 nm or less.

11. A method of forming a capacitor comprising a bottom electrode to be initially formed by performing a deposition process, the method comprising:

identifying a minimum precursor particle size to be used in said deposition process;

forming a layer of insulating material above a semiconducting substrate;

forming a capacitor opening in said layer of insulating material, said capacitor opening having sidewalls;

forming a sealing liner that is positioned only on said sidewalls of said capacitor opening, said sealing liner being made of a material having an opening size that is less than said precursor particle size, wherein forming said sealing liner layer comprises depositing a layer of sealing material above said layer of insulating material and in said capacitor opening and performing an anisotropic etching process on said layer of sealing material that removes horizontally positioned portions of the layer of sealing material;

performing said deposition process to initially form said bottom electrode in said capacitor opening and on said sealing liner forming an insulating material layer on said first metal layer; and forming a second metal layer on said insulating material layer.

12. The method of claim 11, further comprising performing said deposition process to form additional capacitors in a layer of insulating material above another substrate.

* * * * *